US011695438B2

(12) United States Patent
Wintner et al.

(10) Patent No.: US 11,695,438 B2
(45) Date of Patent: Jul. 4, 2023

(54) EXPANDABLE ARCHITECTURE AND BUS FOR CONSUMER GATEWAY

(71) Applicant: Veea Inc., New York, NY (US)

(72) Inventors: Perry Wintner, New York, NY (US); Dave Doyle, New York, NY (US); Michael Liccone, Scotch Plains, NJ (US); Bob Migliorino, Wayne, NJ (US); Shaun Joseph Greaney, Freehold, NJ (US); Theodore Lubbe, New York, NY (US); Michael Mirabella, New York, NY (US); Clint Smith, New York, NY (US)

(73) Assignee: VEEA INC., New York, NY (US)

( * ) Notice: Subject to any disclaimer, the term of this patent is extended or adjusted under 35 U.S.C. 154(b) by 271 days.

(21) Appl. No.: 17/126,858

(22) Filed: Dec. 18, 2020

(65) Prior Publication Data
US 2021/0194514 A1  Jun. 24, 2021

Related U.S. Application Data

(60) Provisional application No. 62/952,937, filed on Dec. 23, 2019.

(51) Int. Cl.
*H04B 1/036* (2006.01)
*H05K 7/20* (2006.01)

(52) U.S. Cl.
CPC ......... *H04B 1/036* (2013.01); *H05K 7/20163* (2013.01); *H05K 7/20409* (2013.01)

(58) Field of Classification Search
CPC .......... G06F 1/1698; G06F 1/181; G06F 1/20; G06F 1/203; G06F 1/206;

(Continued)

(56) References Cited

U.S. PATENT DOCUMENTS

2012/0155015 A1* 6/2012 Govindasamy ......... H01L 23/36
361/688
2014/0009894 A1  1/2014 Yu
(Continued)

FOREIGN PATENT DOCUMENTS

EP  2 114 113 B1  11/2009

OTHER PUBLICATIONS

International Preliminary Report on Patentability received from the the International Bureau of WIPO in related International Application No. PCT/US2020/066525 dated Jun. 28, 2022.
(Continued)

*Primary Examiner* — Nguyen T Vo
(74) *Attorney, Agent, or Firm* — The Marbury Law Group, PLLC

(57) ABSTRACT

The embodiments include a stackable computing device that includes an integrated heatsink and antenna structure and a housing structure. The housing structure includes a housing casing that surrounds the integrated heatsink and antenna structure. The integrated heatsink and antenna structure includes a heatsink base and one or more radio frequency (RF) antenna portions. The heatsink base includes a connector port that provides an interface between components of the computing device and other computing or peripheral devices. For example, the heatsink base may include platform that is configured to have circuitry fixedly secured on a first side of the platform with a connector of the circuitry aligned with an aperture of the connector port such that a connection to the circuitry is accepted by circuitry of another computing device.

7 Claims, 15 Drawing Sheets

(58) Field of Classification Search
CPC ........... G06F 2200/1635; H01L 23/367; H01L 23/3672; H01Q 1/02; H01Q 1/246; H01Q 1/42; H04B 1/036; H05K 7/20163; H05K 7/20409
See application file for complete search history.

(56) References Cited

U.S. PATENT DOCUMENTS

| | | | |
|---|---|---|---|
| 2015/0289389 A1 | 10/2015 | Conway et al. | |
| 2018/0219277 A1* | 8/2018 | Hirata | H01Q 1/02 |
| 2018/0342784 A1* | 11/2018 | Samardzija | H01Q 1/38 |
| 2022/0140869 A1* | 5/2022 | Ji | H04B 7/0452 |
| | | | 375/262 |
| 2022/0352647 A1* | 11/2022 | Tang | H01Q 21/064 |

OTHER PUBLICATIONS

International Search Report and the Written Opinion of the International Searching Authority received in related International Application No. PCT/US2020/066525 dated Apr. 23, 2021.

\* cited by examiner

EXPANDABLE ARCHITECTURE AND BUS FOR CONSUMER GATEWAY

This application claims the benefit of priority to U.S. Provisional Application No. 62/952,937, entitled "Expandable Architecture And Bus For Consumer Gateway" filed Dec. 23, 2019, the entire contents of which are hereby incorporated by reference for all purposes.

BACKGROUND

Wireless communication technologies have been growing in popularity and use over the past several years. This growth has been fueled by better communications hardware, larger networks, and more reliable protocols. Wireless and Internet service providers are now able to offer their customers with an ever-expanding array of features and services, such as robust cloud-based services.

To better support these enhancements, more powerful consumer facing edge devices (e.g., consumer grade access points, IoT gateways, routers, switches, etc.) are beginning to emerge. These devices include more powerful processors, system-on-chips (SoCs), memories, antennas, power amplifiers, and other resources (e.g., power rails, etc.) that better support high-speed wireless communications and execute complex and power intensive applications facilitating edge computing.

In addition to high performance and functionality, consumers increasingly demand that their devices be affordable, future-proof (e.g., upgradeable, highly versatile, etc.) and small enough to readily placed throughout a home or small office.

SUMMARY

The various aspects include a computing device (stackable computing device) that includes an integrated heatsink and antenna structure that includes a heatsink base and one or more radio frequency (RF) antenna portions, and a housing structure that includes a housing casing that surrounds the integrated heatsink and antenna structure, in which the heatsink base of the integrated heatsink and antenna structure includes a connector port that provides an interface between components of the computing device and other computing or peripheral devices.

In some aspects, the connector port may include an electro-mechanical interface that provides access to unused system busses and resources of the computing device after deployment in the field. In some aspects, the connector port may be configured to allow additional computing devices to be stacked onto the computing device to form a combined unit that operates as a single unified computing device. In some aspects, components of the computing device may be configured to operate so as to provide a baseline feature set, and the additional stacked computing devices may expand or enhance the baseline feature set by adding to the memory, processing, or communication resources to the computing device.

In some aspects, the connector port may be configured to allow the computing device and the additional computing devices to use a common communication and power bus interface. In some aspects, the one or more RF antenna portions may include at least one or more of a long term evolution (LTE) antenna portion, a fourth generation wireless mobile communication technology (4G) antenna portion, a fifth generation wireless mobile communication technology (5G) antenna portion, or a global positioning system antenna portion.

In some aspects, the housing structure may include a housing casing configured to surround an integrated heatsink and antenna structure removably secured therein (in which the housing casing forms an inner cavity for holding the integrated heatsink and antenna structure), a housing cover removably secured to a top side of the housing casing so that when secured to the topside of the housing casing the housing cover conceals the inner cavity from view from the top side of the housing casing, and a housing base removably secured to a bottom side of the housing casing so that when secured to the bottom side of the housing casing the housing base conceals the inner cavity from view from the bottom side of the housing casing, in which removal of at least one of the housing cover or the housing base allows an additional unit to be stacked with and coupled to the integrated heatsink and antenna structure secured with the housing casing.

In some aspects, the housing casing may be configured to surround an integrated heatsink and antenna structure that may include a heatsink base and one or more radio frequency (RF) antenna portions. In some aspects, the housing casing may be configured to surround an integrated heatsink and antenna structure that may include a connector port that provides an interface between components of the integrated heatsink and antenna structure and other computers or peripheral devices.

In some aspects, removal of at least one of the housing cover or the housing base allows a computing device to be stacked with and coupled to the integrated heatsink and antenna structure secured with the housing casing. In some aspects, removal of at least one of the housing cover or the housing base allows a second integrated heatsink and antenna structure cased in a second housing to be stacked with and coupled to the integrated heatsink and antenna structure secured with the housing casing.

In some aspects, the integrated heatsink and antenna structure may include a cavity onto which at least one of a processor, a computing system, a printed circuit board, an integrated circuit (IC) chip, a system on chip (SOC), or a system in a package (SIP) may placed, and the housing casing may be configured to surround the integrated heatsink and antenna structure and the at least one processor, computing system, printed circuit board, IC chip, SOC or SIP placed onto the cavity of the integrated heatsink and antenna.

In some aspects, the housing casing may be configured to surround an integrated heatsink and antenna structure that may include a radio frequency antenna portion and a heatsink portion, the radio frequency antenna portion operates to improve the thermal performance of the heatsink portion, and the heatsink portion operates to improve one or more antenna properties of the radio frequency antenna portion.

In some aspects, the heatsink base of the integrated heatsink and antenna structure of the stackable computing device may include a frame structure, a plurality of fin components projecting outwardly from the frame structure (the plurality of fin components being configured to receive and hold one or more radio frequency (RF) antenna portions) and a platform substantially surrounded by the frame structure. The platform may include an aperture extending through the platform to provide or support a connector port. The platform may be configured, equipped, arranged, formed or shaped to have circuitry fixedly secured on a first side of the platform with a connector of the circuitry aligned with the aperture such that a connection to the circuitry is accepted by circuitry of another heatsink base through the aperture from an opposed second side of the platform. In some aspects, the circuitry fixedly secured on the first side of the platform may include an electro-mechanical interface that provides access to unused system busses and resources after deployment in the field.

In some aspects, the platform of the heatsink base may be a planar structure forming a partition of an inner cavity within the frame structure. In some aspects, a first portion of the inner cavity on the first side of the platform may larger than a second portion of the inner cavity on the second side of the platform. In some aspects, the frame structure may have a rectangular or square form. In some aspects, the frame structure may be shaped to improve the omnidirectional pattern of the one or more RF antenna portions.

BRIEF DESCRIPTION OF THE DRAWINGS

The accompanying drawings, which are incorporated herein and constitute part of this specification, illustrate exemplary aspects of the claims, and together with the general description given above and the detailed description given below, serve to explain the features of the claims.

DETAILED DESCRIPTION

Various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

In overview, the embodiments include a stackable computing device (e.g., edge device, etc.) that includes a baseline feature set, and an expandable architecture that allows end users to add specific features or functionality (e.g., digital concierge, home assistant, etc.) to the device as needed. The expandable architecture allows end users to purchase a relatively inexpensive base unit, and upgrade or customize the device's features or capabilities based on their specific needs. The expandable architecture also allows the device to remain compatible with the fast-paced evolving technology roadmap confronting 5G and beyond. Rather than replacing the device with another that better supports these new and emerging features, the end user may add features sets to the existing device.

The stackable computing device may be a base unit, or a combined unit that includes a base unit and additional units. The base unit and its components may be configured, shaped, formed or arranged so that the customer or user can quickly physically attach additional units (e.g., an auxiliary unit, another base unit, etc.) above, below, or to the sides of the base unit. The additional units may be other base units or independent computing systems that are capable of operating on their own. As is discussed in more detail below, the additional units be attached in a variety of different ways and/or to form a variety of different configurations. Once attached, the combined unit (i.e., the base unit and the attached additional units) may operate as a single unified computing device (or a single unified edge device).

The additional units may expand or enhance the baseline feature set of the base unit by adding to the existing memory, processing, and/or communication resources of the base unit. The additional units may also expand the baseline feature set by adding new resources or capabilities to the base unit, such as support for a new radio access technology, decoding audio, processing light, receiving external inputs, adding external relay contacts to, for example, turn other devices on or off, receive inputs from external devices, etc.

Any or all of the units in the combined unit may expose systems buses and resources in a manner that allows those units to be readily expanded to support additional feature sets, but which preserves the performance and integrity of the individual units and of the combined device. The additional units may have additional system buses that may or may not be part of the system bus of the base unit. The exposure of these and other buses may help ensure the future expandability of the combined unit.

Figure 8:
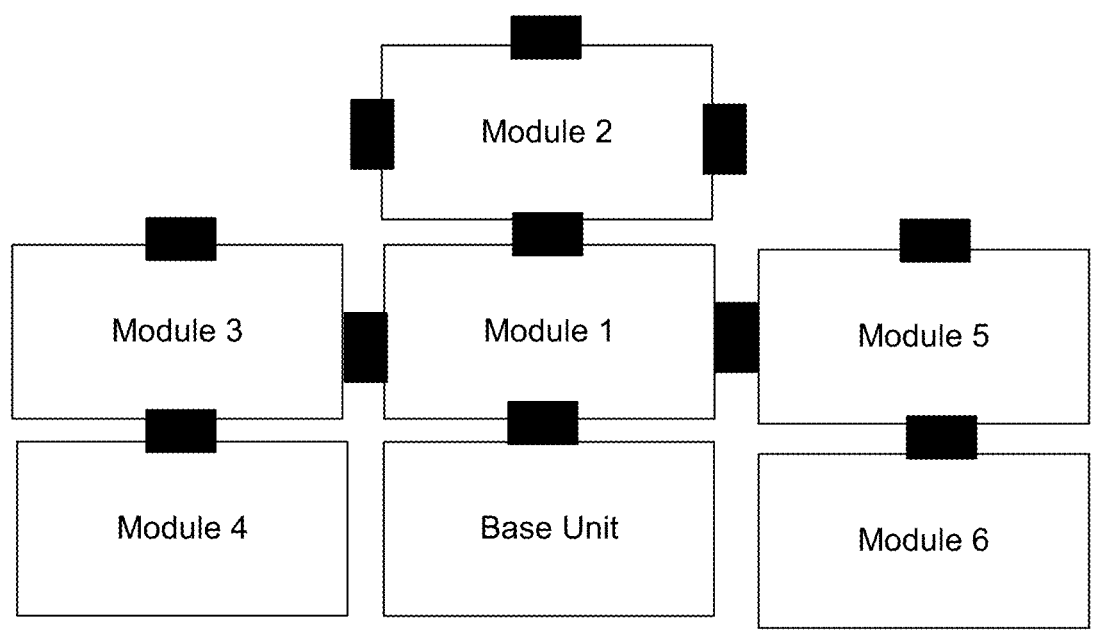
FIG. 8-10 are component block diagrams illustrating different that the computing system may be stacked or combined in various different configurations in some embodiments.

In some embodiments, the stackable computing device may include an electro-mechanical interface such that unused system busses and resources may be accessed and/or retro-fitted by the end user, after deployment, or in the field. In some embodiments, such as the embodiment illustrated in FIG. 2A, the electro-mechanical interface may be positioned on the top or bottom of the stackable computing device to support vertical stacking. In some embodiments, such as the embodiment illustrated in FIG. 8, the electro-mechanical interface may be positioned on the side of the stackable computing device to support horizontal stacks. In some embodiments, two or more electrical mechanical interfaces may be used. For example, one electrical mechanical interface may be used to connect to the base unit or higher-level unit, and other mechanical interfaces may be used to connect to other units. The electro-mechanical interfaces may or may not be included in the same bus depending on the functionality the unit or units perform. Additionally, an interface plug may be connected to one of the exposed electro-mechanical interfaces, facilitating different connection and interface options. The interface plug may also include the necessary hardware to perform protocol and or level conversions.

In some embodiments, the electro-mechanical interface may be configured to facilitate the user interfacing the base unit with a component that provides quantum computing capability. The unit or units connected directly to or relayed by other units may include quantum computing capability interfacing and leveraging the base processing and other functions of the base unit and the associated units.

In some embodiments, the electro-mechanical interface may be configured to provide connectivity for additional power sources, which may be tied to the existing power bus for unit expansion.

The various embodiments may include, use, incorporate, implement, provide access to a variety of wired and wireless communication networks, technologies and standards that are currently available or contemplated in the future, including any or all of Bluetooth®, Bluetooth Low Energy, Zig-Bee, LoRa, Wireless HART, Weightless P, DASH7, RPMA, RFID, NFC, LwM2M, Adaptive Network Topology (ANT), Worldwide Interoperability for Microwave Access (WiMAX), WIFI, WiFi6, WIFI Protected Access I & II (WPA, WPA2), personal area networks (PAN), local area networks (LAN), metropolitan area networks (MAN), wide area networks (WAN), networks that implement the data over cable service interface specification (DOCSIS), networks that utilize asymmetric digital subscriber line (ADSL) technologies, third generation partnership project (3GPP), long term evolution (LTE) systems, LTE-Direct, third generation wireless mobile communication technology (3G), fourth generation wireless mobile communication technology (4G), fifth generation wireless mobile communication technology (5G), global system for mobile communications (GSM), universal mobile telecommunications system (UMTS), high-speed downlink packet access (HSDPA), 3GSM, general packet radio service (GPRS), code division multiple access (CDMA) systems (e.g., cdmaOne, CDMA2000™), enhanced data rates for GSM evolution (EDGE), advanced mobile phone system (AMPS), digital AMPS (IS-136/TDMA), evolution-data optimized (EV-DO), digital enhanced cordless telecommunications (DECT), etc. Each of these wired and wireless technologies involves, for example, the transmission and reception of data, signaling and/or content messages.

Any references to terminology and/or technical details related to an individual wired or wireless communications standard or technology are for illustrative purposes only, and not intended to limit the scope of the claims to a particular communication system or technology unless specifically recited in the claim language.

The term "computing device" may be used herein to refer to any one or all of quantum computing devices, edge devices, Internet access gateways, modems, routers, network switches, residential gateways, access points, integrated access devices (IAD), mobile convergence products, networking adapters, multiplexers, personal computers, laptop computers, tablet computers, user equipment (UE), smailphones, personal or mobile multi-media players, personal data assistants (PDAs), palm-top computers, wireless electronic mail receivers, multimedia Internet enabled cellular telephones, gaming systems (e.g., PlayStation™, Xbox™, Nintendo Switch™, etc.), wearable devices (e.g., smartwatch, head-mounted display, fitness tracker, etc.), IoT devices (e.g., smart televisions, smart speakers, smart locks, lighting systems, smart switches, smart plugs, smart doorbells, smart doorbell cameras, smart air pollution/quality monitors, smart smoke alarms, security systems, smart thermostats, etc.), media players (e.g., DVD players, ROKU™, AppleTV™, etc.), digital video recorders (DVRs), and other similar devices that include a programmable processor and communications circuitry for providing the functionality described herein.

The term "quantum computing device" may be used herein to refer to a computing device or edge device, whether it is a standalone device or used in conjunction with current computing processes, that generates or manipulates quantum bits (qubits) or which utilizes quantum memory states. A quantum computing device may enhance edge computing capability by providing solutions that would be challenging to implement via conventional computing systems. This is especially true with value added computing for leveraging a diverse amount of senor and other input data to arrive at a solution in real time. Through unifying diverse data sources a quantum computing solution at the edge may accelerate machine learning, solve complex problems faster as well as provide the fundamental platform for artificial intelligence nodes at the edge of the network. With the vast array of data delivered by sensors as well state information the quantum computing process may improve the memory allocation though the use of superposition allowing for more information to be simultaneously stored and processed.

The term "edge device" may be used herein to refer to a computing device that includes a programmable processor and communications circuitry for establishing communication links to consumer devices (e.g., smal tphones, UEs, IoT devices, etc.) and/or to network components in a service provider, core, cloud, or enterprise network. For example, an edge device may include or implement functionality associated any one or all of an access point, gateway, modem, router, network switch, residential gateway, mobile convergence product, networking adapter, customer premise device, multiplexer and/or other similar devices.

Various different types of antennas are available or contemplated in the future. To focus the discussion on the most important details, some embodiments are described with reference to planar inverted-F antennas. However, nothing in this application should be use to limit the scope of the claims to a specific type antenna unless expressly recited as such in the claims.

Generally, components and circuitry within a computing device (e.g., base unit, combined unit, etc.) generate heat or thermal energy, which at excessive levels may damage or reduce the performance of the computing device. The amount of thermal energy that is generated may vary depending upon the components included in the computing device, operating conditions, and/or the operations or activities in the computing device. For example, a computing device that wirelessly transmits data for a sustained time period at a high power-level may require that a power amplifier feed its antennas. The power amplifier may generate a significant amount of thermal energy that could have a negative impact on the performance of the computing device. As another example, processors and other components in the computing device generate a significant amount thermal energy when the performing complex tasks, such as processing video, using cryptographic technology, or implementing machine learning. The thermal energy generated by these processors/components could damage the device, shorten the operating life of the device, cause the device to abruptly shut down, or otherwise have a negative impact on the device's reliability or performance characteristics.

Many modern computing systems are equipped with heat dissipating structures that help ensure the device does not operate at unsafe temperatures that damage or shorten the operating life of the device. Modern computing systems are often also equipped with radiating structures (antennas) for sending and receiving wireless communications.

In many conventional systems, the heat dissipating structures are separate and independent of radiating structures, and thus compete with one another for product volume (e.g., space with in the device). For these and other reasons, device manufacturers have had to either build devices that are large enough to include both the heat dissipating and radiating structures (e.g., personal computers, laptops, routers, etc.) or build smaller but less powerful devices (e.g., smal tphones, IoT devices, etc.) that attempt to balance tradeoffs between performance and power consumption. Device manufacturers that opt to build the small and mid-sized devices often carve away sections of the heat dissipating structure (heatsinks) to make room for the radiating structures (antennas), or vice versa. The tradeoff or reduction in heat dissipation structure size for antenna installation reduces the thermal performance of the device because it decreases the surface area of the heat dissipating structure. This also degrades the radiation patterns on the radiating structures and may otherwise have a negative impact on the device's performance or reliability.

In some embodiments, the stackable computing device may include an integrated heatsink and antenna structure. The integrated heatsink and antenna structure may be configured or arranged so that it is suitable for inclusion in small and midsized computing devices and/or to overcome the above-described limitations of conventional solutions.

In some embodiments, the integrated heatsink and antenna structure may include heatsink portions and RF antenna portions. The heatsink portions may provide a path for dissipating thermal energy or heat generated by the components in the device (e.g., printed circuit boards, processors, voltage amplifiers, etc.). The RF antenna portions may allow the device to send and receive wireless communications.

In some embodiments, the integrated heatsink and antenna structure may be formed so that RF antenna portions operate to improve the thermal performance of the heatsink portions and/or so that the heatsink portions operate to improve the antenna properties (e.g., radiation patterns, radiation efficiency, bandwidth, input impedance, polarization, directivity, gain, beam-width, voltage standing wave ratio, etc.) of the RF antenna portions. These improvements in thermal performance and/or antenna properties may allow device manufacturers to build more powerful small and midsized devices that provide robust functionality (e.g., via additional antennas, more powerful processors that generate more heat, etc.) and which may be formed into more visually appealing shapes.

In some embodiments, the stackable computing device may include a housing structure that includes a housing casing that surrounds the integrated heatsink and antenna structure. The integrated heatsink and antenna structure may include a heatsink base and one or more radio frequency (RF) antenna portions. The RF antenna portions may include at least one or more of an LTE antenna portion, a 5G antenna portion, or a GPS antenna portion.

In some embodiments, the heatsink base of the integrated heatsink and antenna structure may include a connector port that provides an interface between components of the computing device and other computing or peripheral devices. In some embodiments, the connector port may include an electro-mechanical interface that provides access to unused system busses and resources of the computing device after deployment in the field. In some embodiments, the connector port may be configured to allow additional computing devices to be stacked onto the computing device to form a combined unit that operates as a single unified computing device. In some embodiments, the components of the computing device included on the integrated heatsink and antenna structure may operate to provide a baseline feature set, and the additional stacked computing devices expand or enhance the baseline feature set by adding to the memory, processing, or communication resources to the computing device. In some embodiments, the connector port may be configured to allow the computing device and the additional computing devices to use a common communication and power bus interface. In some embodiments, the RF antenna portions include at least one or more of an LTE antenna portion, a 5G antenna portion, or a GPS antenna portion.

In some embodiments, the housing structure of the stackable computing device may include a housing casing, a housing cover, and a housing base. The housing casing be configured, shaped or formed to surround the integrated heatsink and antenna structure (which is removably secured therein). The housing casing may form an inner cavity for holding the integrated heatsink and antenna structure.

The housing cover may be removably secured to a top side of the housing casing so that, when secured to the topside of the housing casing, the housing cover conceals the inner cavity from view from the top side of the housing casing. The housing base may be removably secured to a bottom side of the housing casing so that, when secured to the bottom side of the housing casing, the housing base conceals the inner cavity from view from the bottom side of the housing casing.

The housing structure and/or the stackable computing device may be configured, equipped or arranged such that removal of the housing cover or the housing base may allow an additional unit (e.g., another stackable computing device, etc.) to be stacked with and coupled to the integrated heatsink and antenna structure secured with the housing casing. For example, the housing structure and/or the stackable computing device may also be configured, equipped or arranged such that removal of at least one of the housing cover or the housing base allows a second integrated heatsink and antenna structure cased in a second housing to be stacked with and coupled to the integrated heatsink and antenna structure secured with the housing casing.

In some embodiments, the integrated heatsink and antenna structure may include a heatsink base, one or more radio frequency (RF) antenna portions, and/or a connector port that provides an interface between components of the computing device and other computers or peripheral devices (e.g., additional units, etc.).

In some embodiments, the integrated heatsink and antenna structure may include a cavity onto which at least one of a processor, a computing system, a printed circuit board, an integrated circuit (IC) chip, a system on chip (SOC), or a system in a package (SIP) may placed.

In some embodiments, the housing casing may be configured, equipped, arranged, formed or shaped to surround the integrated heatsink and antenna structure and the at least one processor, computing system, printed circuit board, integrated circuit (IC) chip, system on chip (SOC), or system in a package (SIP) placed onto the cavity of the integrated heatsink and antenna.

In some embodiments, the housing casing may be configured, equipped, arranged, formed or shaped to surround an integrated heatsink and antenna structure that includes a radio frequency antenna portion and a heatsink portion. In some embodiments, the radio frequency antenna portion may operate to improve the thermal performance of the heatsink portion, and the heatsink portion may operate to improve one or more antenna properties of the radio frequency antenna portion.

In some embodiments, the heatsink base of the integrated heatsink and antenna structure of the stackable computing device may include a frame structure, a plurality of fin components projecting outwardly from the frame structure (the plurality of fin components being configured to receive and hold one or more radio frequency (RF) antenna portions) and a platform substantially surrounded by the frame structure. The platform may include an aperture extending through the platform to provide or support a connector port. The platform may be configured, equipped, arranged, formed or shaped to have circuitry fixedly secured on a first side of the platform with a connector of the circuitry aligned with the aperture such that a connection to the circuitry is accepted by circuitry of another heatsink base through the aperture from an opposed second side of the platform. In some embodiments, the circuitry fixedly secured on the first side of the platform may include an electro-mechanical interface that provides access to unused system busses and resources after deployment in the field.

In some embodiments, the platform of the heatsink base may be a planar structure forming a partition of an inner cavity within the frame structure. In some embodiments, a first portion of the inner cavity on the first side of the platform may larger than a second portion of the inner cavity on the second side of the platform. In some embodiments, the frame structure may have a rectangular or square form.

In some embodiments, the frame structure may be shaped to improve the omnidirectional pattern of the one or more RF antenna portions.

Figure 1A:
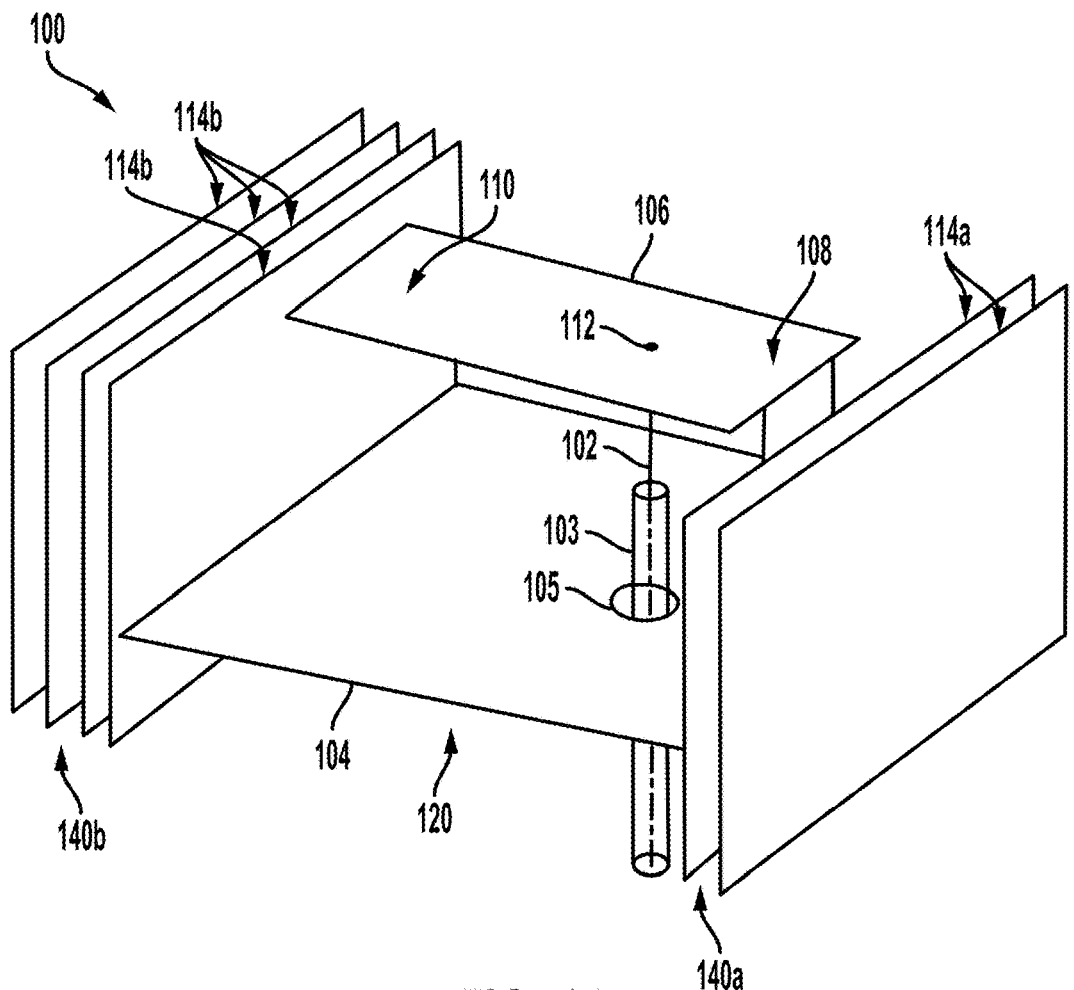
FIG. 1A is a schematic isometric view of an integrated heatsink and antenna structure in accordance with various embodiments.
Figure 1B:
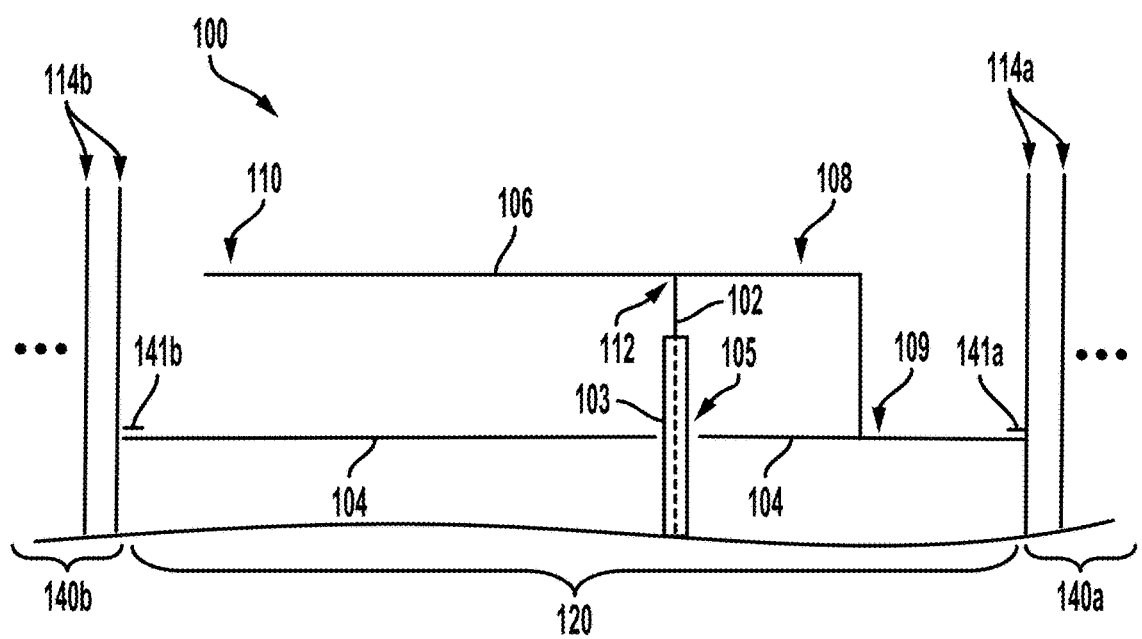
FIG. 1B is a front elevation view of the integrated heatsink and antenna structure of FIG. 1A in accordance with various embodiments.

FIGS. 1A and 1B illustrate an integrated heatsink and antenna structure 100 in accordance with the embodiments. The integrated heatsink and antenna structure 100 may include an RF antenna portion 120 for sending and receiving wireless communications and heatsink portions 140a, 140b configured to dissipate thermal energy or heat. In some embodiments, the RF antenna portion 120 may operate to improve the thermal performance of one or more of the heatsink portions 140a, 140b.

The RF antenna portion 120 may be (or may be plated with) aluminum, copper, stainless steel, beryllium copper, phosphor bronze or any other similar material or composition. The heatsink portions 140a, 140b may be (or may be plated with) aluminum, copper, or any other material or composition suitable for dissipating heat. For example, in an embodiment, the RF antenna portion 120 may be copper and the heatsink portions 140a, 140b may be aluminum.

In the examples illustrated in FIGS. 1A and 1B, the RF antenna portion 120 are formed as a planar inverted-F antenna. In particular, the RF antenna portion 120 may include a feed component 102, a ground plane component 104, and a radiating component 106. The radiating component 106 may have an L-shape, such that one leg of the L extends substantially parallel to and is offset from the ground plane component 104, while a second leg of the L (e.g., formed after a bend in the radiating component 106) extends substantially perpendicular to the first leg toward the ground plane component 104. In addition, one end of the second leg may be attached to or integrally formed with the ground plane component 104 at the grounded end 109.

In some embodiments (e.g., embodiments in which an antenna portion 120 is not formed as a planar inverted-F antenna, etc.), a monopole could be designed with the heat sink as ground reference. Further, some embodiments may include a ground plane independent primary radiator (e.g. dipole, etc.) that uses the heatsink as a field shaping structure (dish on a dish antenna).

Returning to examples illustrated in FIGS. 1A and 1B, the feed component 102 may be electrically couple to a computing device (not illustrated), in which the integrated heatsink and antenna structure 100 is included. Also, the feed component 102 may be fixedly secured (e.g., soldered) to the radiating component 106 at a feed point 112. In this way, the feed component 102 extends from the feed point 112, through an aperture 105 in the ground plane component 104, and to a physical connection with the computing device. The feed component 102 may include a casing or sheathing 105 that insolates the feed component 102. The feed point 112 may be disposed between a shorted portion 108 and a radiating portion 110 of the radiating component 106. The shorted portion 108 may extend away from the feed point 112, substantially parallel to the ground plane component 104 until the bend, beyond which the remainder of the shorted portion 108 extends toward the ground plane component 104 such that the grounded end 109 ends in contact with the ground plane component 104. In this way, the shorted portion 108 may be configured to electrically short one end of the radiating component 106 to the ground plane component 104. The radiating portion 110 may extend away from the feed point 112, in the opposite direction from the shorted portion 108, extending substantially parallel to the ground plane component 104, but include a remote end that is not attached to any other component or portion of the integrated heatsink and antenna structure 100.

The heatsink portions 140a, 140b may each include fin components 114a, 114b that provide thermal resistance and additional surface area for improved thermal performance. The first fin of heatsink portion 140b may provide capacitive tuning to the open end of the 2.4 GHz patches. This may allow the patches to be smaller that would be the case without the fin.

In various embodiments, the fin components 114a, 114b may be (or may be plated with) aluminum, copper, or any other material or composition suitable for dissipating heat. In addition, the fin components 114a, 114b may be formed of a material suitable for also enhancing one or more antenna properties (e.g., radiation patterns, radiation efficiency, bandwidth, input impedance, polarization, directivity, gain, beam-width, voltage standing wave ratio, etc.) of the RF antenna portion 120. A greater or fewer number of fin components 114a, 114b may be included as part of the heatsink portions 140a, 140b (i.e., illustrated as ellipses on the outer right and left sides of FIG. 1B).

The ground plane component 104 may be coupled to one or more of the fin components 114a, 114b and/or arranged to dissipate additional thermal energy and further improve thermal performance, similar to the fin components 114a, 114b. For example, an innermost one of each of the fin components 114a, 114b may include tabs 141a, 141b that hold the ground plane component 104 in place. Additional components may bias the ground plane component 104 into contact with the tabs 141a, 141b, thus securing (i.e., holding) the RF antenna portion 120 and the heatsink portions 140a, 140b together. Alternatively, a clip or slot may be provided on or in the innermost ones of the fin components 114a, 114b for securing the ground plane component 104 to the fin components 114a, 114b. In this way, securing the ground plane component 104 to the fin components 114a, 114b couples the RF antenna portion 120 to the heatsink portions 140a, 140b. Also, this coupling may produce a synergistic effect of providing an RF antenna portion 120 that improves the thermal performance of the heatsink portions 140a, 140b, as well as heatsink portions 140a, 140b that improve the antenna properties of the RF antenna portion 120.

The computing device, in which the integrated heatsink and antenna structure 100 is included, may dissipate the same amount of heat and/or achieve the same thermal performance as conventional devices that have larger structures that include larger or a greater number of fin components that occupy more area. In accordance with various embodiments, the integrated heatsink and antenna structure 100 may be packaged into a smaller or more compact container and/or to include additional or more powerful components (e.g., additional antennas, more powerful processors that generate more heat, etc.) than conventional devices.

Figure 2A:
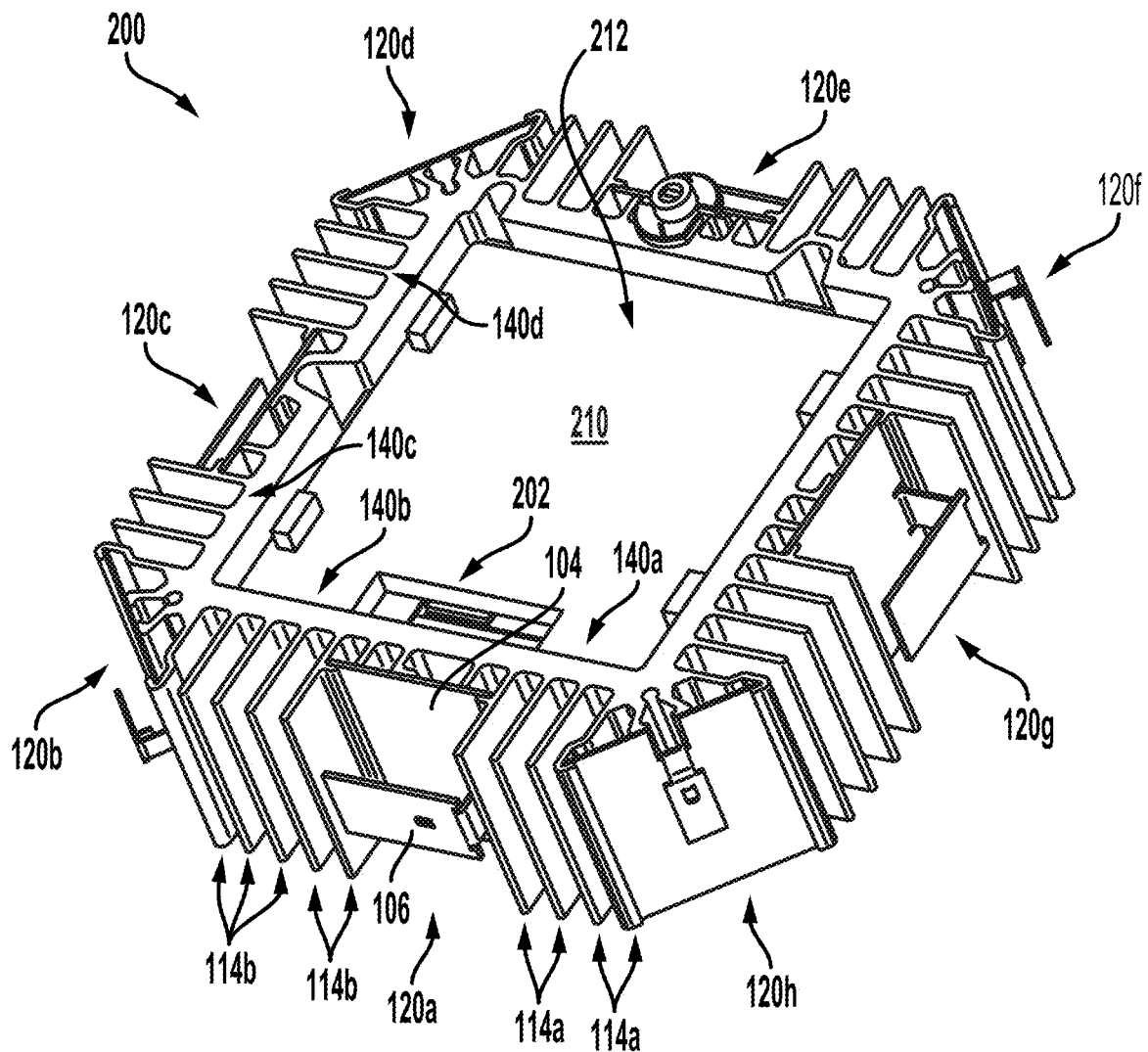
FIGS. 2A-C are isometric, top, and side views, respectively of an integrated heatsink and antenna structure that include multiple radio frequency (RF) antennas with corresponding heat sink portions in accordance with some embodiments.
Figure 2B:
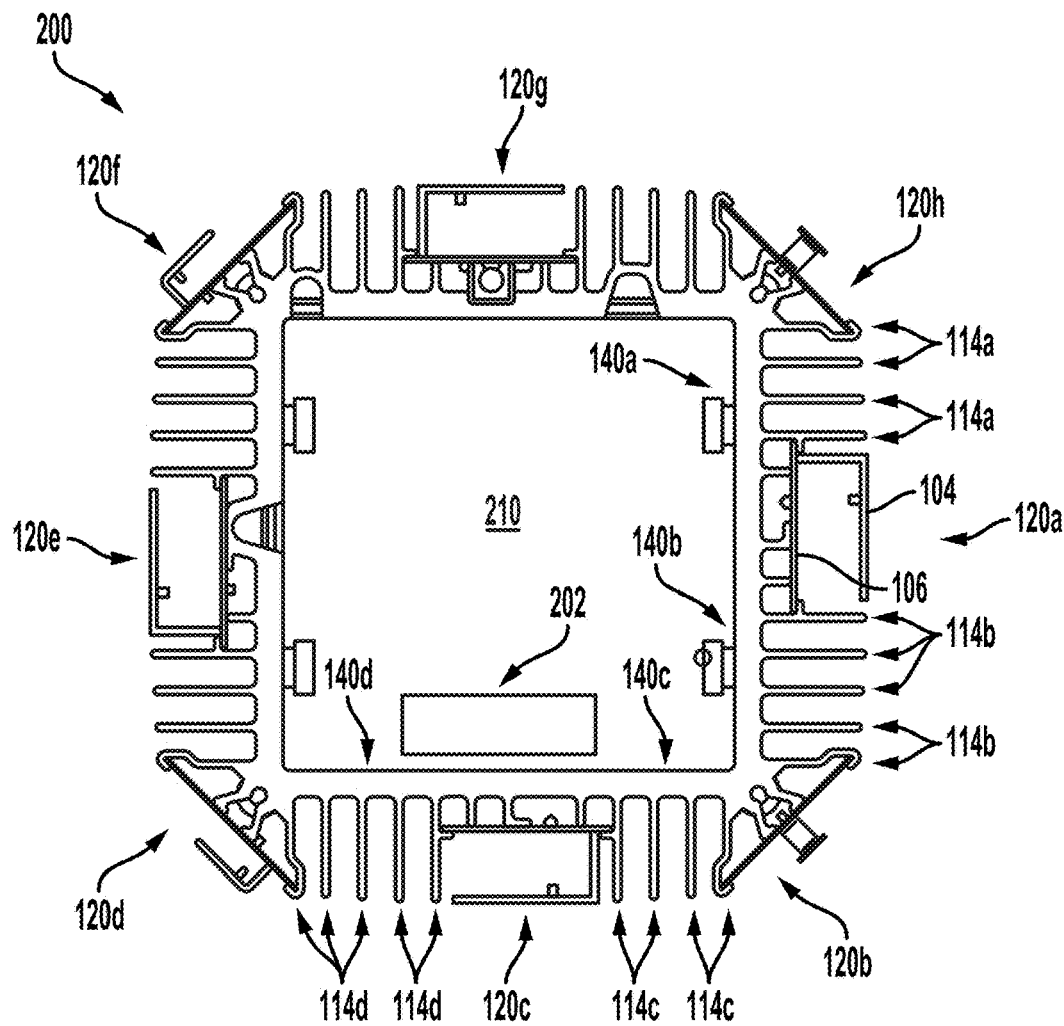
Figure 2C:
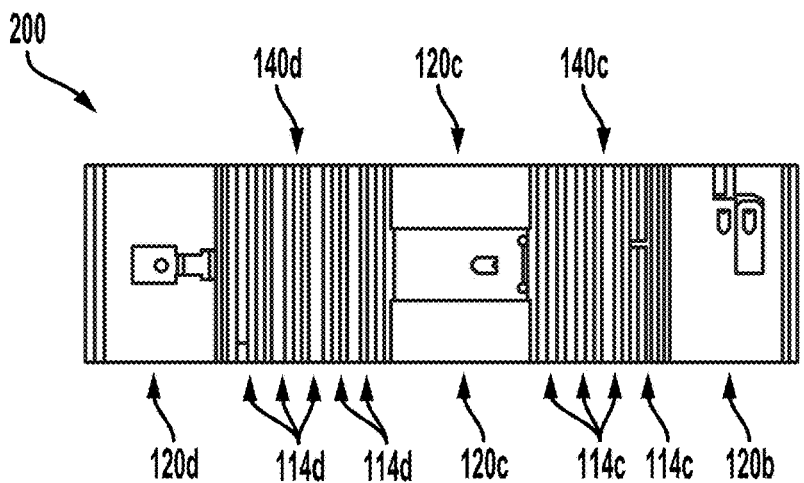

FIGS. 2A-2C illustrate an integrated heatsink and antenna structure 200 that includes multiple sets of the integrated heatsink and antenna structure 100 described above with regard to FIGS. 1A and 1B, in accordance with some embodiments. The integrated heatsink and antenna structure 200 may include a cavity 212 onto which a processor, computing system, printed circuit board, integrated circuit (IC) chips, a system on chip (SOC), or system in a package (SIP) and/or other similar components may be implemented or placed. In some embodiments, the integrated heatsink and antenna structure 200 may include a connector port 202 that provides an interface between components of the integrated heatsink and antenna structure 200 (or components of the computing device, base unit, etc.) and other computers or peripheral devices. The connector port 202 may include an electro-mechanical interface such that unused system busses and resources of the device may be accessed and/or retrofitted by the end user, after deployment, or in the field. The connector port 202 may allow additional units to be attached in a variety of different ways and/or to form a variety of different configurations. Once attached, the combined unit (i.e., the base unit and the attached additional units) may operate as a single unified computing device. The additional units may expand or enhance the baseline feature set of the computing device by adding to the existing memory, processing, and/or communication resources placed on the cavity 212. The additional units may also expand the baseline feature set by adding new resources or capabilities, such as support for a new radio access technology, decoding audio, processing light, receiving external inputs, adding external relay contacts to, for example, turn other devices on or off, receive inputs from external devices, etc.

In the example illustrated in FIG. 2A, the connector port 202 is represented as a port that supports horizontal stacking. However, it should be understood that in the various embodiments, the connector port 202 may include multiple ports that each support horizontal (or vertical) stacking.

In some embodiments, the integrated heatsink and antenna 200 may include multiple antennas. In the illustrated examples, the integrated heatsink and antenna structure 200 includes eight (8) RF antenna portions 120a-h coupled to a heatsink base 210. The heatsink base 210 may be configured, shaped or arranged to improve the omnidirectional pattern of the antenna portions (120a-h).

Each of the RF antenna portions 120a-h may be coupled to and surrounded by fin components (e.g., 114a-d) integrated into the heatsink base 210 and that dissipate thermal energy. For example, four (4) of the RF antenna portions 120a, 120c, 120e, 120g may be disposed on the sides of the integrated heatsink and antenna structure 200, each having a similar configuration to that described with regard to integrated heatsink and antenna structure 100 in FIGS. 1A and 1B. In contrast, four (4) more of the RF antenna portions 120b, 120d, 120f, 120h may be disposed on the corners of the integrated heatsink and antenna structure 200, each flanked by sets of fin components (e.g., 114b, 114c), but those flanking fin components may be disposed on two different sides of the integrated heatsink and antenna structure 200.

As mentioned above, the integrated heatsink and antenna structure 200 may include a cavity 212 onto which a processor, computing system, printed circuit board, integrated circuit (IC) chips, a system on chip (SOC), or system in a package (SIP) and/or other similar components may be implemented or placed, and a connector port 202 that provides an interface between those components/chips (e.g., processors, ICs, SOC, SIP, etc.) and corresponding components on other or additional units. As also mentioned above, the connector port 202 may include multiple ports that each support stacking one or more additional units or components (i.e., there may be additional connector ports proving interfaces, etc.). In some embodiments, the components/chips may be placed on a heat conducting material (not illustrated separately in FIGS. 2A-C) that is placed on top of the cavity 212 (or aluminum housing) to help with the heat transfer and to address any imperfections that arise during manufacturing.

In some embodiments, the integrated heatsink and antenna structure 200 may configured, formed, or arranged to dissipate between approximately 15 to 20 Watts/mm$^2$ (or Watts/inch) from the chip to the integrated heatsink and antenna structure 200, from the integrated heatsink and antenna structure 200 to ambient air, and/or from the chip to ambient air.

As mentioned above, the integrated heatsink and antenna structure 200 may include multiple RF antennas 120a-h. The RF antennas 120a-h may include wideband, multiband, and/or ultrawideband (UWB) antennas. For example, the RF antennas 120a-h may include patch antennas, inverted-L antennas, inverted-F antennas (e.g., planar inverted-F antenna (PIFA), dual frequency PIFA, etc.) or any other antenna suitable for wireless applications. In some embodiments, the RF antennas 120a-h and/or the antenna pattern may be selected based on heatsink characteristics (size, area, amount of heat metal, etc.).

As mentioned above, securing the ground plane component 104 to the fin components 114a, 114b couples the RF antenna portions 120 to the heatsink portion. In the various embodiments, the ground plane for any of the RF antenna portions 120 may be changed so that it is potentially smaller than shown in the figures, but running the entire length behind the heatsink fin components 114.

In some embodiments, the fin components 114 may be arranged into a fin structure that is slightly different for each RF antenna portion 120a-h or for each antenna location. In some embodiments, each of the RF antenna portions 120 may be tuned for frequency band and/or modified based on frequency, bandwidth, impedance, proximity to the fin components 114 and/or the corresponding fin structure.

Figure 3:
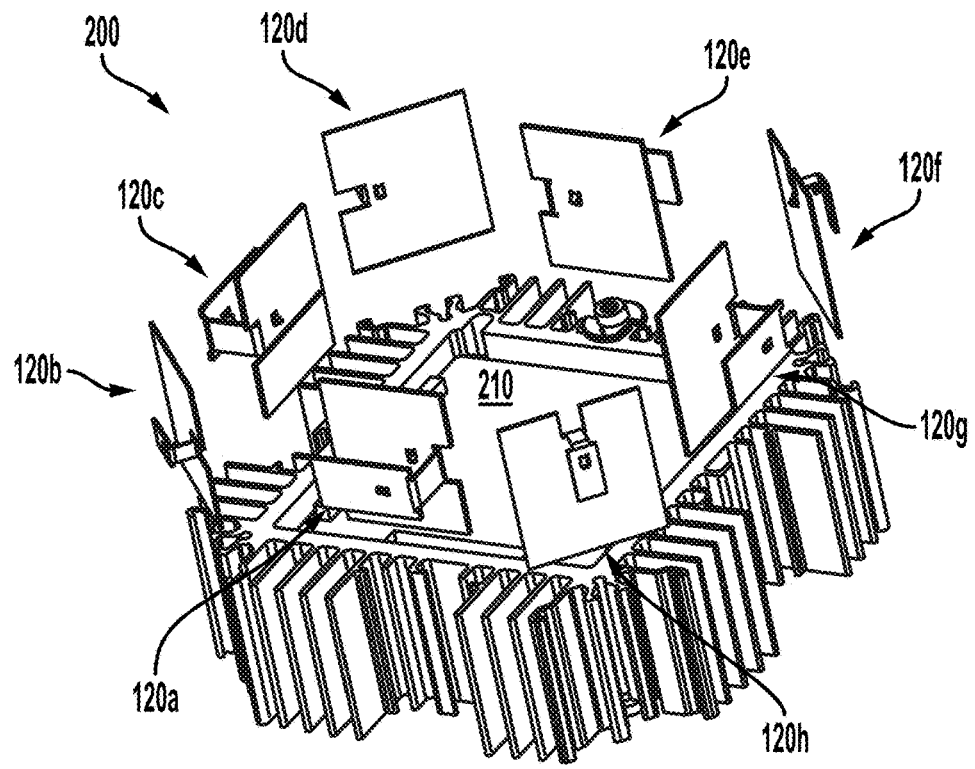
FIG. 3 is a partially exploded isometric view of the integrated heatsink and antenna structure of FIG. 2A.

FIG. 3 illustrates a partially exploded view of the integrated heatsink and antenna structure 200. As shown, the RF antenna portions 120a-h may be separated from and/or attached to the heatsink base component 210 using securing structures incorporated into some of the fin components.

In some embodiment, the antenna elements/portions may be formed curved of a springy material. The heat sink features may hold the antenna elements/portions flat so that so friction (primarily) holds them in place. As such, the RF antenna portions 120*a-h* may be attached to the heatsink base component 210 via a friction fit. In addition, the integrated heatsink and antenna structure 200 may be formed to fit into a plastic housing (not illustrated separately in FIG. 3) that has features that ensure location of the radiating element so that the antennas do not become detuned by having the structure bent out of shape.

Figure 4:
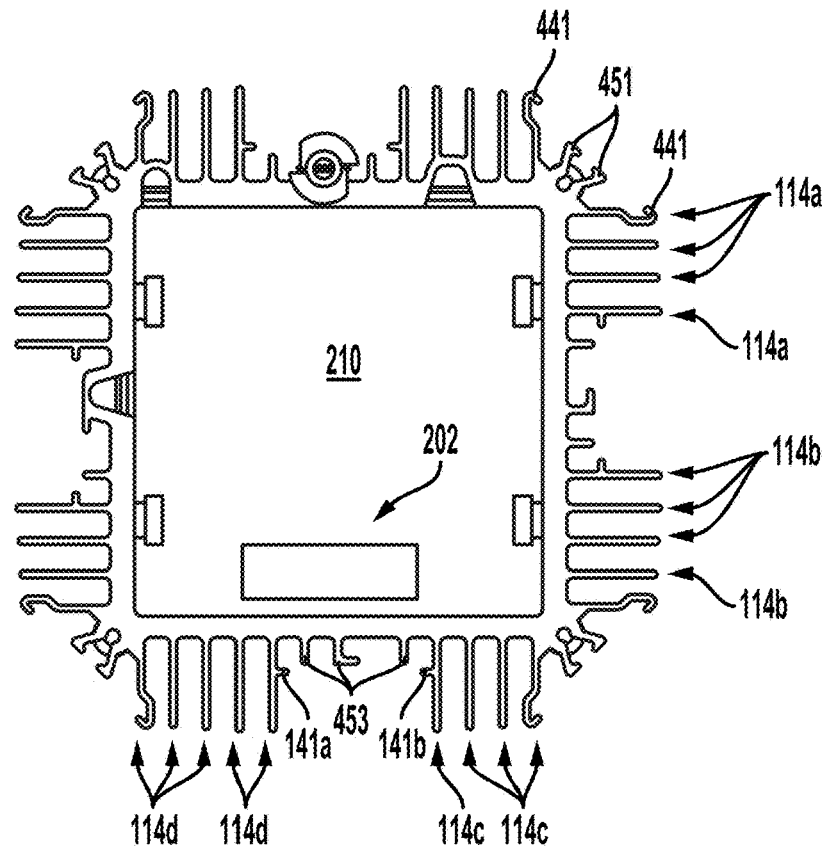
FIG. 4 is an isolated top view of a heatsink base component in accordance with various embodiments.

FIG. 4 illustrates the heatsink base component 210 in accordance with various embodiments. In particular, FIG. shows some of the retaining structures that may be incorporated into some of the fin components for holding and retaining the RF antenna portions (e.g., 120*a-h*). For example, the corner fin components may have hooked ends 441 such that the hooked ends 441 on a pair of opposed corner fin components may bend toward one another. The hooked ends 441 may be used to trap an RF antenna portion. The RF antenna portion may also be supported by corner mini-fins 451 that project out toward the RF antenna portion. In this way, each of the RF antenna portions on the corners of the heatsink base component 210 may be trapped between a pair of the hooked ends 441 and a set of the corner mini-fins 451. Similarly, the RF antenna portions on the sides of the heatsink base component 210 may be trapped between a pair of the tabs 141*a*, 141*b* and a set of additional mini-fins 453.

Figure 5A:
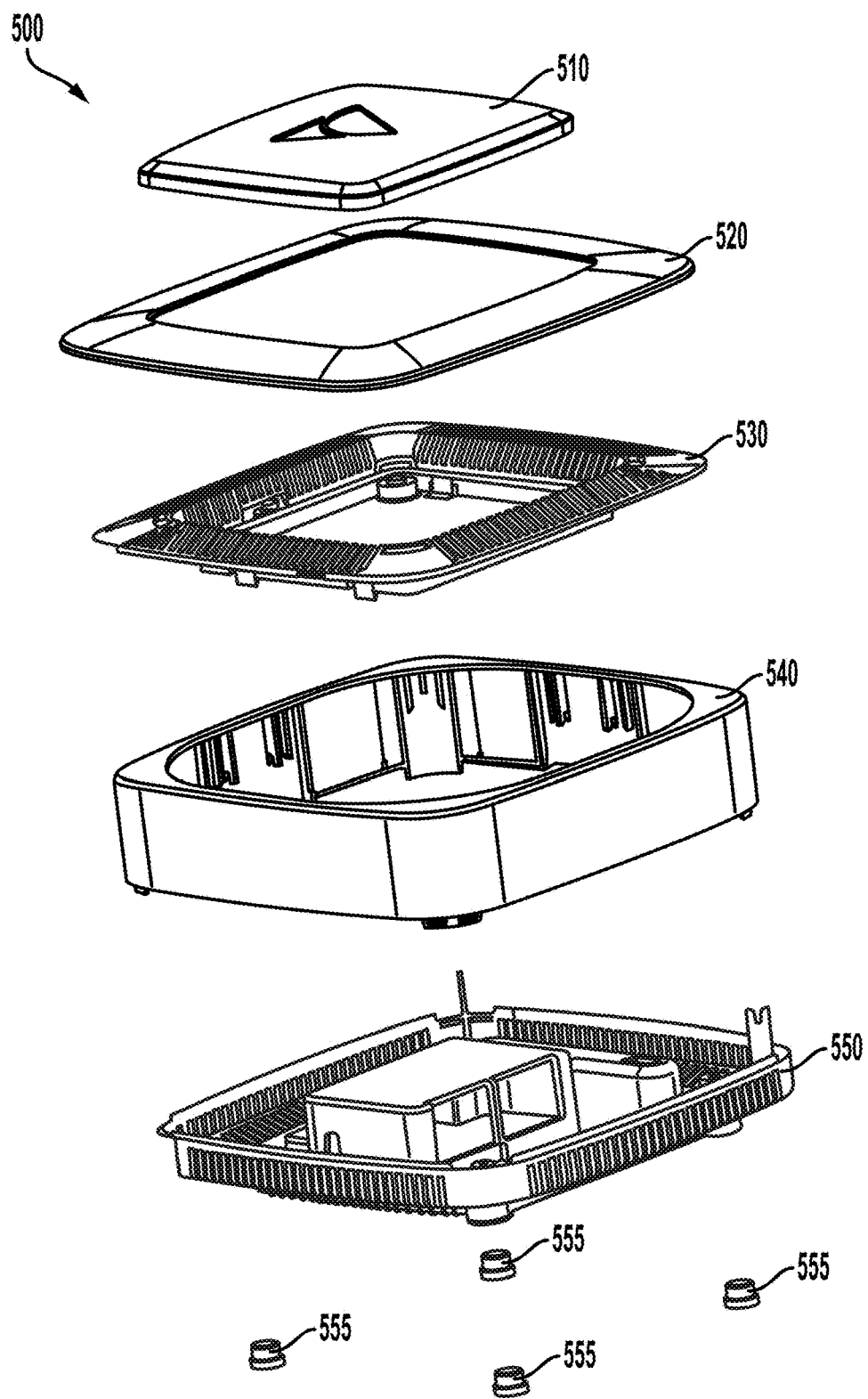
FIGS. 5A and 5B are exploded and assembled isometric views, respectively, of stackable housings for integrated heatsink and antenna structures in accordance with various embodiments.
Figure 5B:
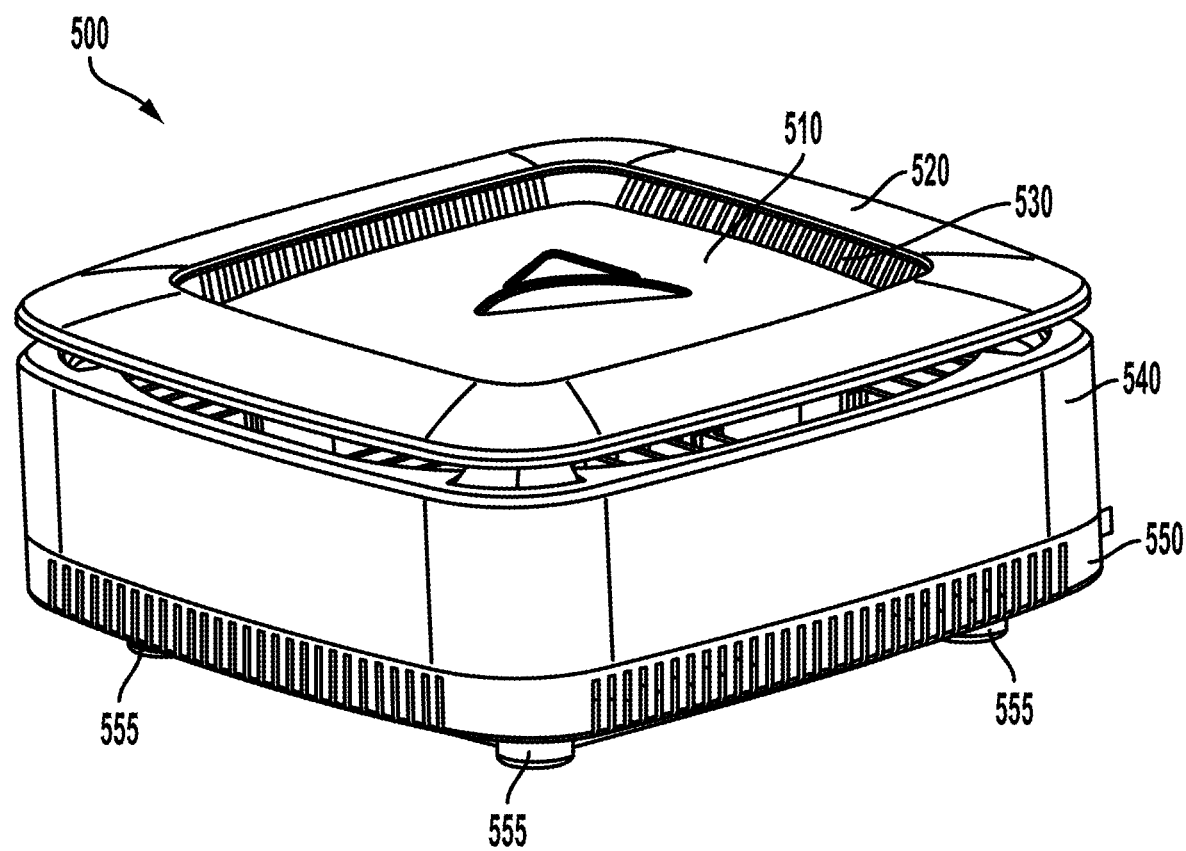

FIGS. 5A and 5B illustrate a stackable housing 500 for an integrated heatsink and antenna structure in accordance with some embodiments. The stackable housing 500 may include a lid 510, an upper rim 520, an upper tray 530, a housing casing 540, housing base 550, and housing feet 555. In accordance with various embodiments, the integrated heatsink and antenna structure (e.g., integrated heatsink and antenna 200 illustrated in FIG. 2A, etc.) may be seated on top of the housing base 550. Once the integrated heatsink and antenna structure 200 is mounted on the housing base 550, the housing casing 540 may be slipped over and surround the integrated heatsink and antenna structure 200. The lid 510, upper rim 520, and upper tray 530 may then close off the assembly by being secured on top of the housing casing 540. Additional components and/or circuitry may be located between the integrated heatsink and antenna structure and the housing base 550. Similarly, components and/or circuitry may be located between the lid 510 and the upper tray 530.

In various embodiments, the stackable housing 500 may be stacked on top of, on the side of, or below another stackable housing 500, which then allows multiple integrated heatsink and antenna structures (e.g., 200) to be used together in a compact arrangement. To stack the stackable housings 500, the lid 510, upper rim 520, and upper tray 530 of all but the uppermost stackable housing 500 may be removed so as to expose one integrated heatsink and antenna structure below to another integrated heatsink and antenna structure above.

Figure 6A:
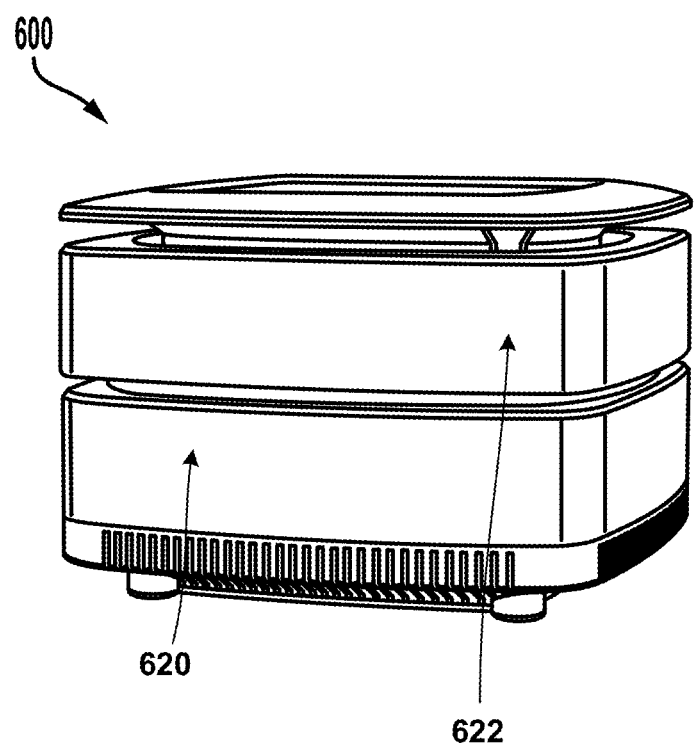
FIG. 6A is an isometric view of two of the stackable housings shown in FIGS. 5A and 5B stacked on top of and couple to one another in accordance with some embodiments.

FIG. 6A illustrates a combined unit 600 that includes a base unit 620 and an additional unit 622 stacked on top of and coupled to one another in accordance with some embodiments.

Figure 6B:
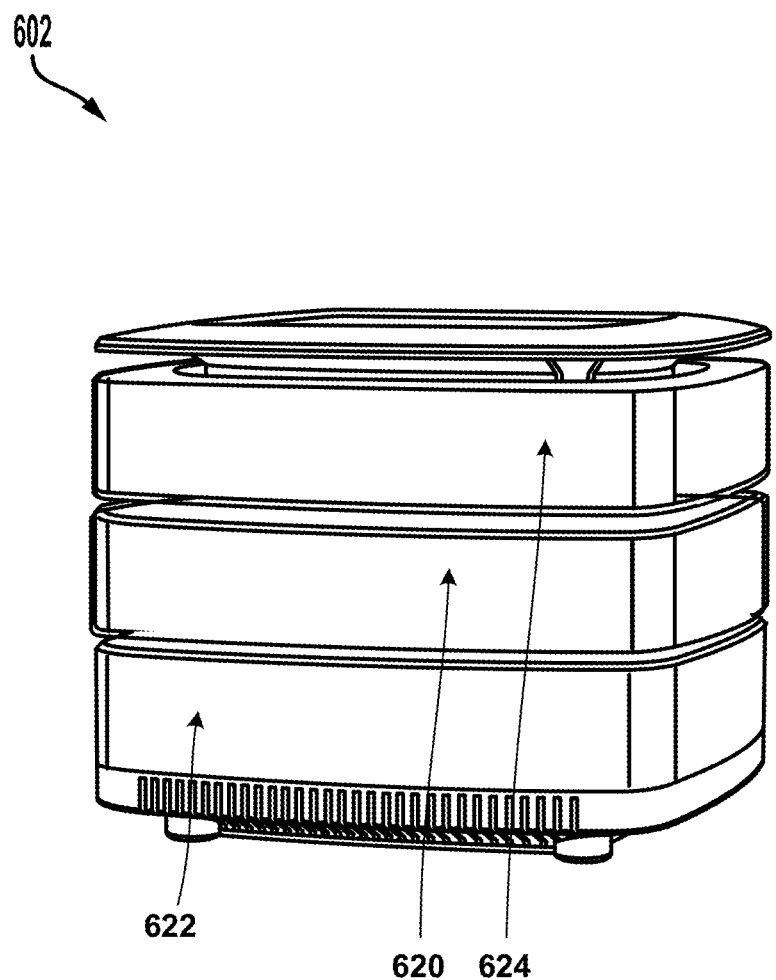
FIG. 6B is an isometric view of three of the stackable housings stacked on top of one another in accordance with some embodiments.

FIG. 6B illustrates a combined unit 602 that includes a base unit 620 and two additional units 622, 624. In the example illustrated in FIG. 6B, one additional unit 624 is stacked on top of the base unit 620, and another additional unit 622 is stacked below the base unit 620. However, it should be understood that the base unit 620 and the additional units 622-624 may be attached in a variety of different ways and/or to form a variety of different configurations in some embodiments.

Figure 6C:
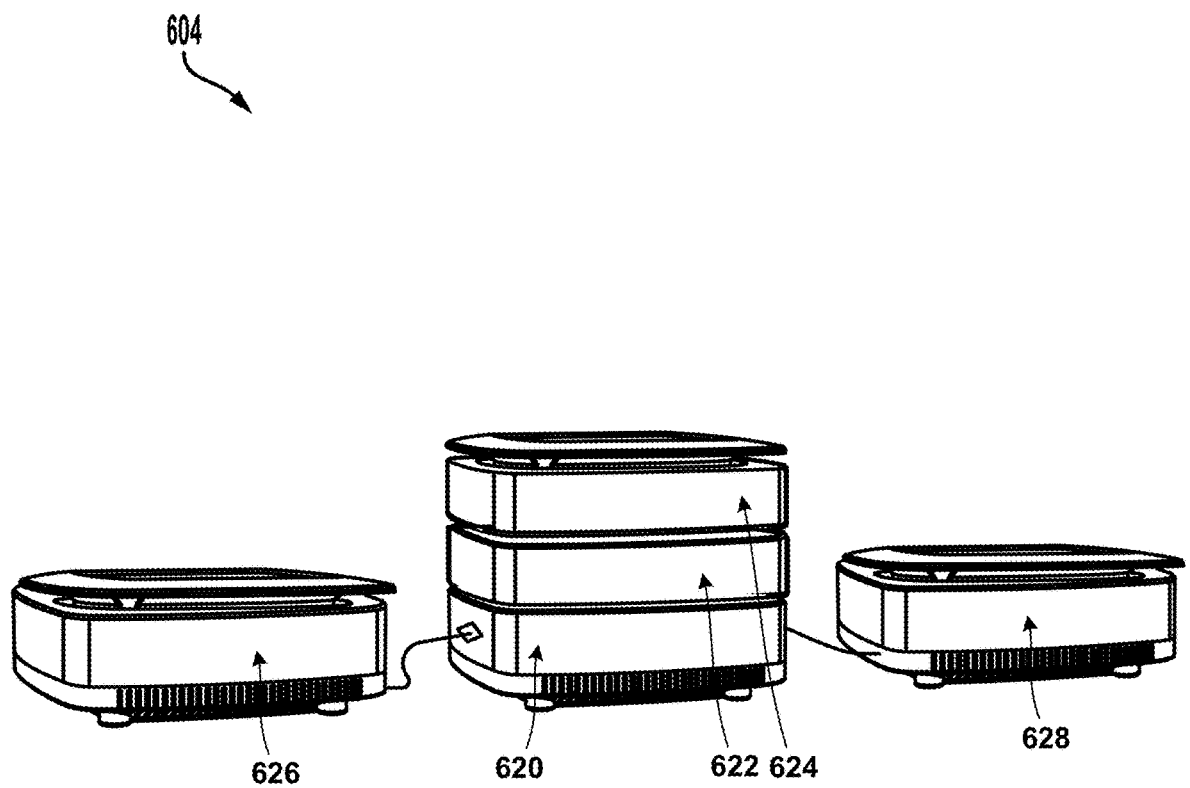
FIGS. 6C and 6D are component block diagrams illustrating that the base unit and the additional units may be attached in a variety of different ways and/or to form a variety of different configurations in some embodiments.

FIG. 6C illustrates a combined unit 604 that includes that a base unit 620 may include two additional units 622, 624 stacked on top of the base unit 620, and two additional units 626, 628 attached to the sides of the base unit 620.

Figure 6D:
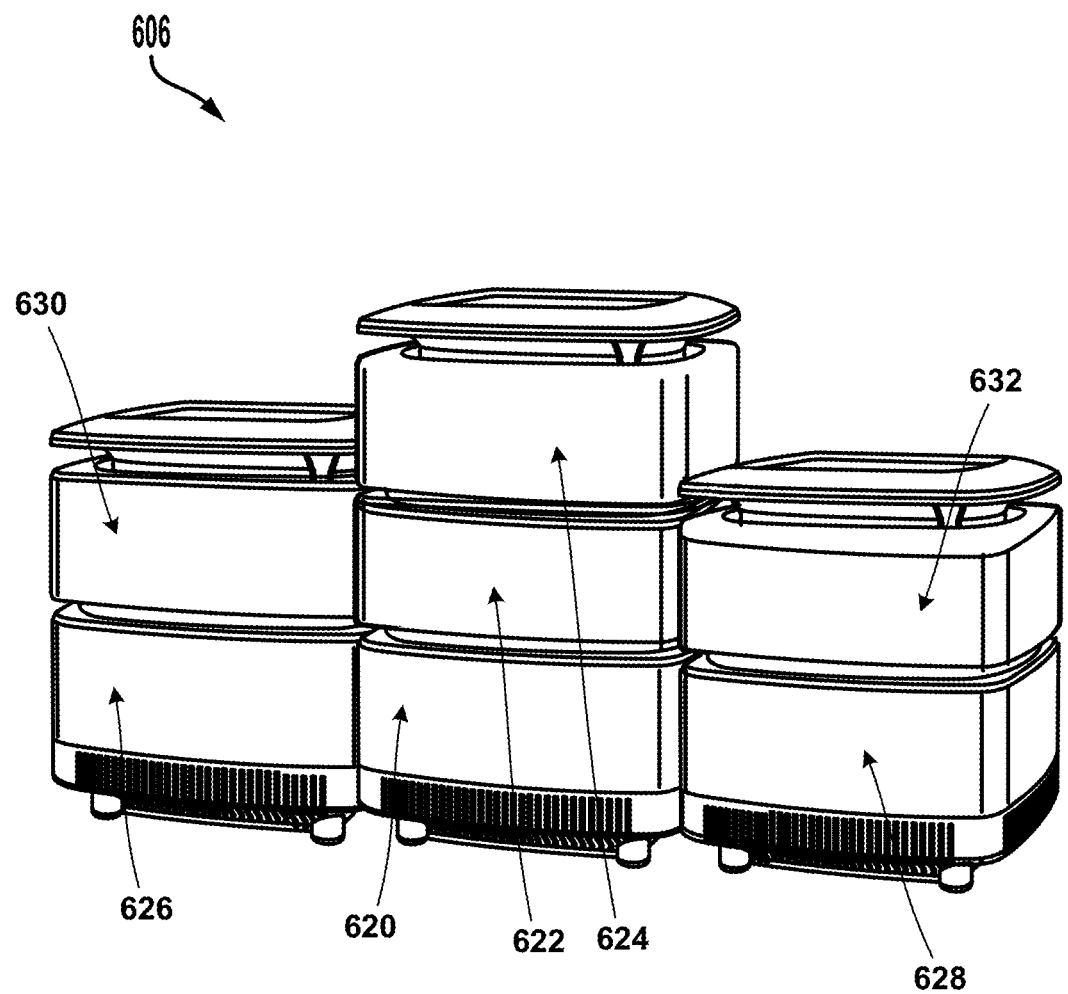

FIG. 6D illustrates a combined unit 606 that includes a base unit 620 may include two additional units 622, 624 stacked on top of the base unit 620 and another two additional units 626, 628 stacked on the sides of the base unit 620. Each of the additional units 626 and 628 may include another additional unit 630, 632 stacked on top.

Figure 7A:
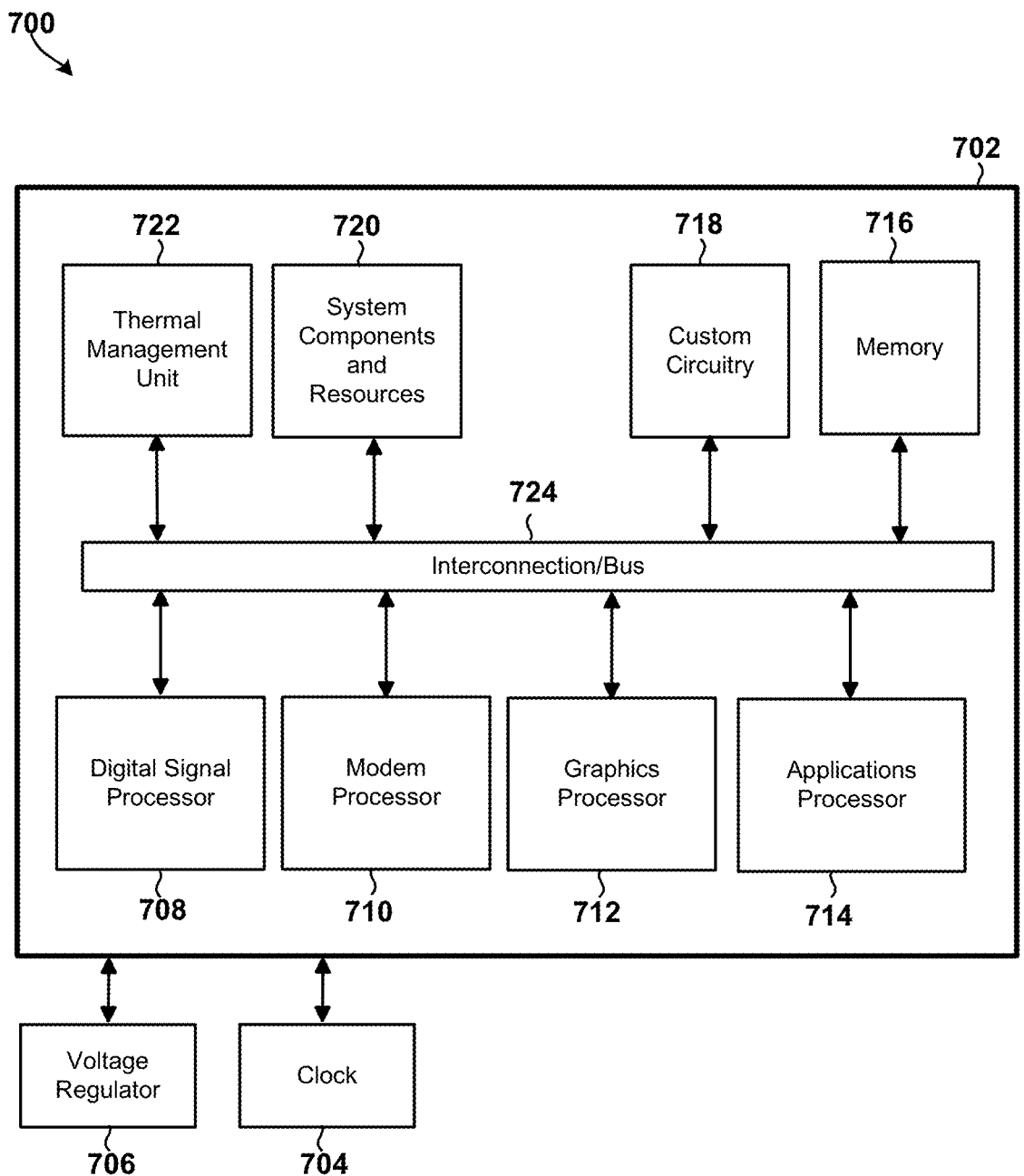
FIGS. 7A and 7B are component block diagrams illustrating a computing system that includes an expandable architecture and a stack connector in accordance with some embodiments.
Figure 7B:
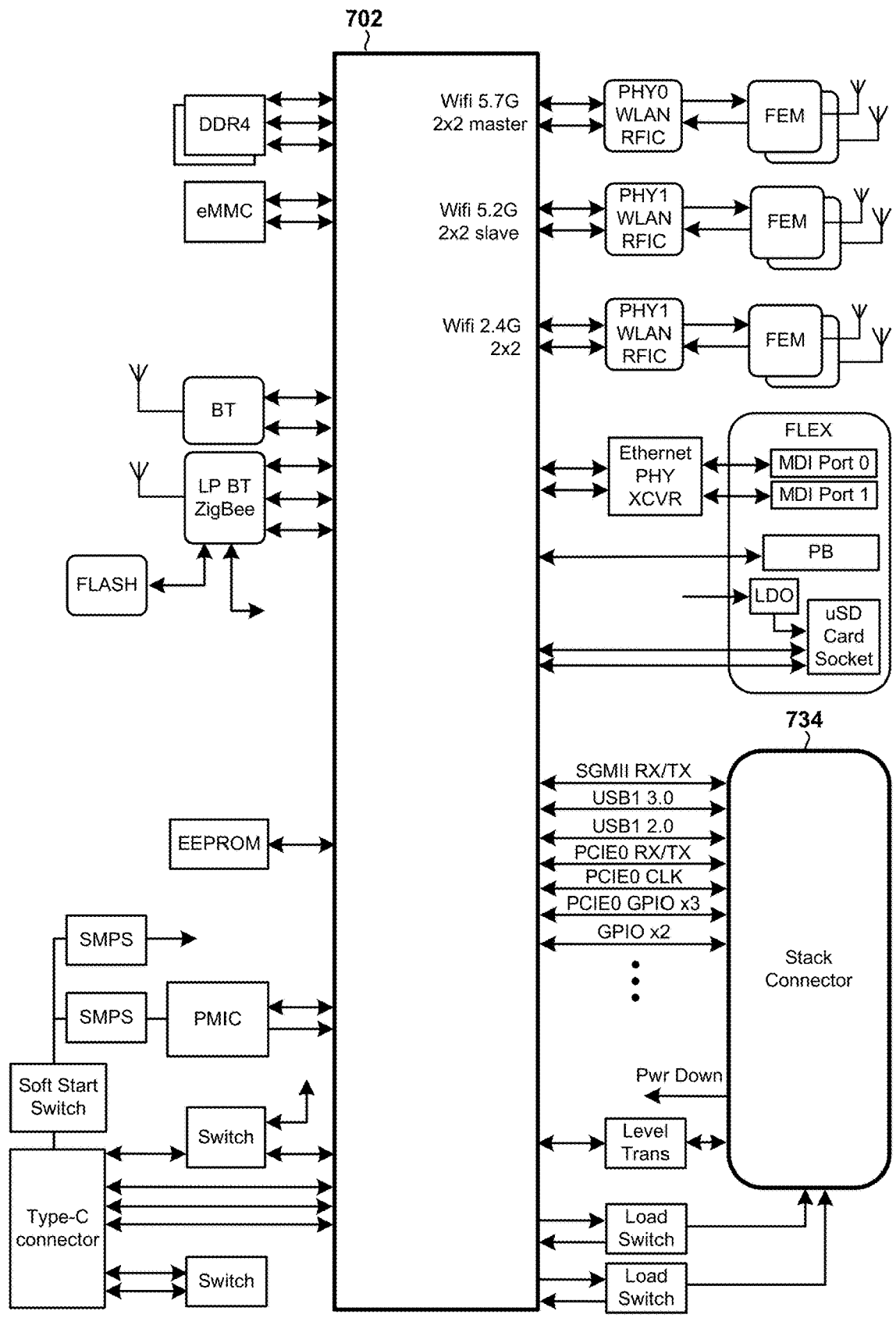

FIGS. 7A and 7B illustrates an example computing system 700 that may be used with integrated heatsink and antenna structure 200 in accordance with some embodiments. In the example illustrated in FIG. 7, the computing system 700 includes an SOC 702, a clock 704, and a voltage regulator 706.

In overview, an SOC may be a single IC chip that contains multiple resources and/or processors integrated on a single substrate. A single SOC may contain circuitry for digital, analog, mixed-signal, and radio-frequency functions. A single SOC may also include any number of general purpose and/or specialized processors (packet processors, etc.), memory blocks (e.g., ROM, RAM, Flash, etc.), and resources (e.g., timers, voltage regulators, oscillators, etc.). SOCs may also include software for controlling the integrated resources and processors, as well as for controlling peripheral devices. The components in an SOC may generate a significant amount of thermal energy or heat, and thus the placement of the components within the SOC, the location of the SOC within the integrated heatsink and antenna structure 200, and other thermal management considerations are often important.

With reference to FIG. 7A, the SOC 702 may include a digital signal processor (DSP) 708, a modem processor 710, a graphics processor 712, an application processor 714 connected to one or more of the processors, memory 716, custom circuitry 718, system components and resources 720, a thermal management unit 722, and an interconnection/bus module 724. The SOC 702 may operate as central processing unit (CPU) that carries out the instructions of software application programs by performing the arithmetic, logical, control and input/output (I/O) operations specified by the instructions.

The thermal management unit 722 may be configured to monitor and manage the device's junction temperature, surface/skin temperatures and/or the ongoing consumption of power by the active components that generate thermal energy in the device. The thermal management unit 722 may determine whether to throttle the performance of active processing components (e.g., CPU, GPU, LCD brightness), the processors that should be throttled, the level to which the frequency of the processors should be throttled, when the throttling should occur, etc.

The system components and resources 720 and custom circuitry 718 may manage sensor data, analog-to-digital conversions, wireless data transmissions, and perform other specialized operations, such as decoding data packets and processing video signals. For example, the system components and resources 720 may include power amplifiers, voltage regulators, oscillators, phase-locked loops, peripheral bridges, temperature sensors (e.g., thermally sensitive resistors, negative temperature coefficient (NTC) thermistors, resistance temperature detectors (RTDs), thermocouples, etc.), semiconductor-based sensors, data controllers, memory controllers, system controllers, access ports, timers, and other similar components used to support the processors and software clients running on a device. The custom circuitry 718 may also include circuitry to interface with other computing systems and peripheral devices, such as wireless communication devices, external memory chips, etc.

Each processor 708, 710, 712, 714 may include one or more cores, and each processor/core may perform operations independent of the other processors/cores. For example, the SOC 702 may include a processor that executes a first type of operating system (e.g., FreeBSD, LINUX, OS X, etc.) and a processor that executes a second type of operating system (e.g., MICROSOFT WINDOWS 10). In addition, any or all of the processors 708, 710, 712, 714 may be included as part of a processor cluster architecture (e.g., a synchronous processor cluster architecture, an asynchronous or heterogeneous processor cluster architecture, etc.).

The processors 708, 710, 712, 714 may be interconnected to one another and to the memory 718, system components and resources 720, and custom circuitry 718, and the thermal management unit 722 via the interconnection/bus module 724. The interconnection/bus module 724 may include an array of reconfigurable logic gates and/or implement a bus architecture (e.g., CoreConnect, AMBA, etc.). Communications may be provided by advanced interconnects, such as high-performance networks-on chip (NoCs).

The SOC 702 may further include an input/output module (not illustrated) for communicating with resources external to the SOC, such as the clock 704 and the voltage regulator 706. Resources external to the SOC (e.g., clock 704, etc.) may be shared by two or more of the internal SOC processors/cores.

In addition to the SOC 702 discussed above, the various embodiments may include or may be implemented in a wide variety of computing systems, which may include a single processor, multiple processors, multicore processors, or any combination thereof.

With reference to FIG. 7B, the computing system 700 may include a stack connector 734, which may correspond to and/or may be used in conjunction with the connector port 202 illustrated in FIGS. 2A, 2B, and 4. The stack connector 734 may include interconnection/bus module with various data and control lines for communicating with the SOC 702. The stack connector 734 may also expose systems buses and resources of a SOC 702 or computing device 700 in a manner that allows the chip or computing system to attach to an additional unit to include additional features, functions or capabilities, but which preserves the performance and integrity of the original SOC 702 or computing device 700.

The stackable units (modules) may also be stacked vertically (as shown in FIGS. 6A-6D, 8 and 10) and/or may be coupled or stacked horizontally (as shown in FIGS. 6C, 6D, 8 and 10). FIGS. 6A-6D, 8 and 10 also illustrate that additional units may be coupled to or stacked above, below, or to the sides of a base unit to create various different configurations or computing architectures.

Figure 9:
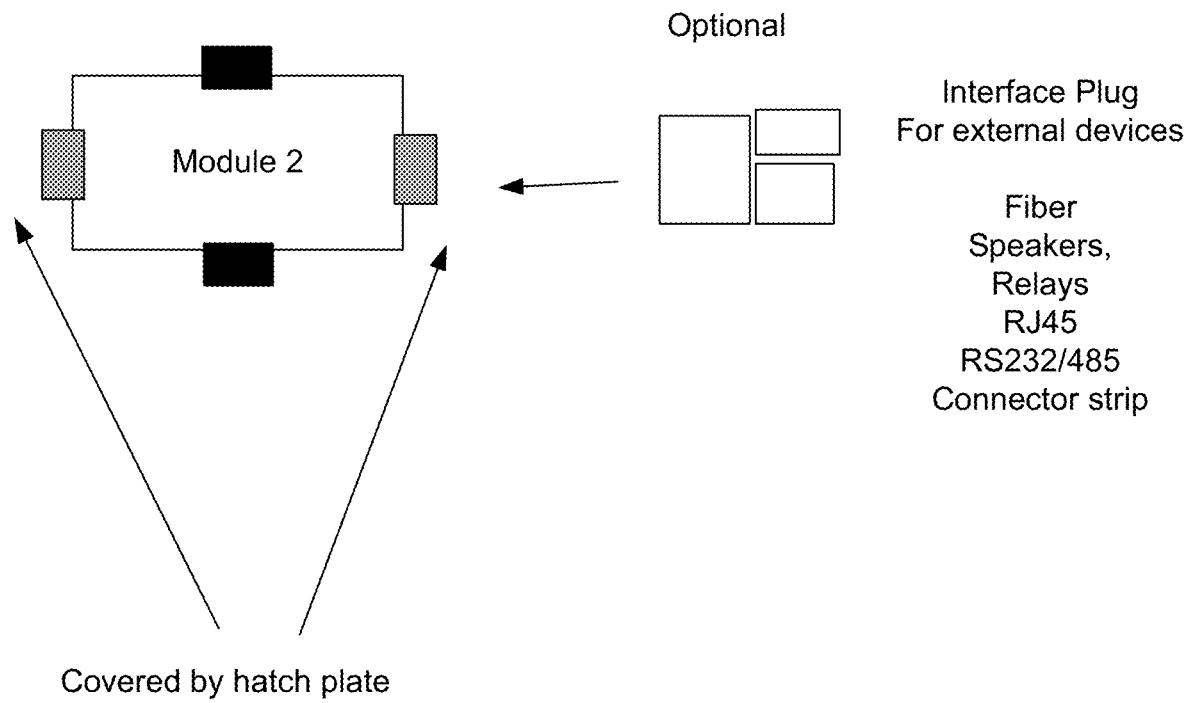
Figure 9:
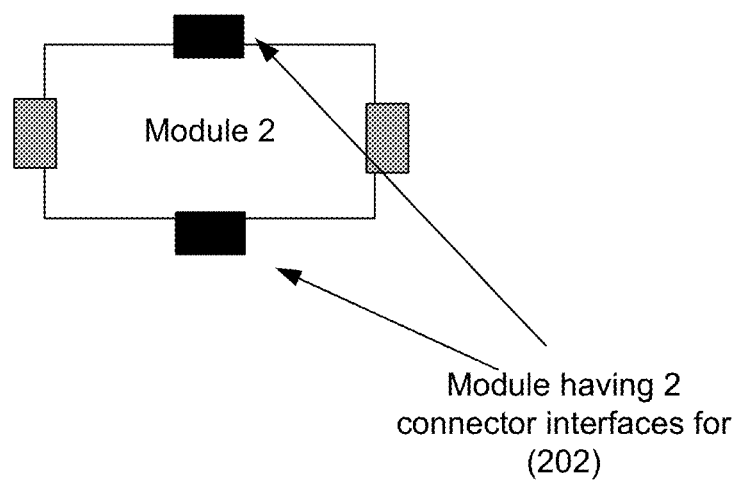
Figure 10:
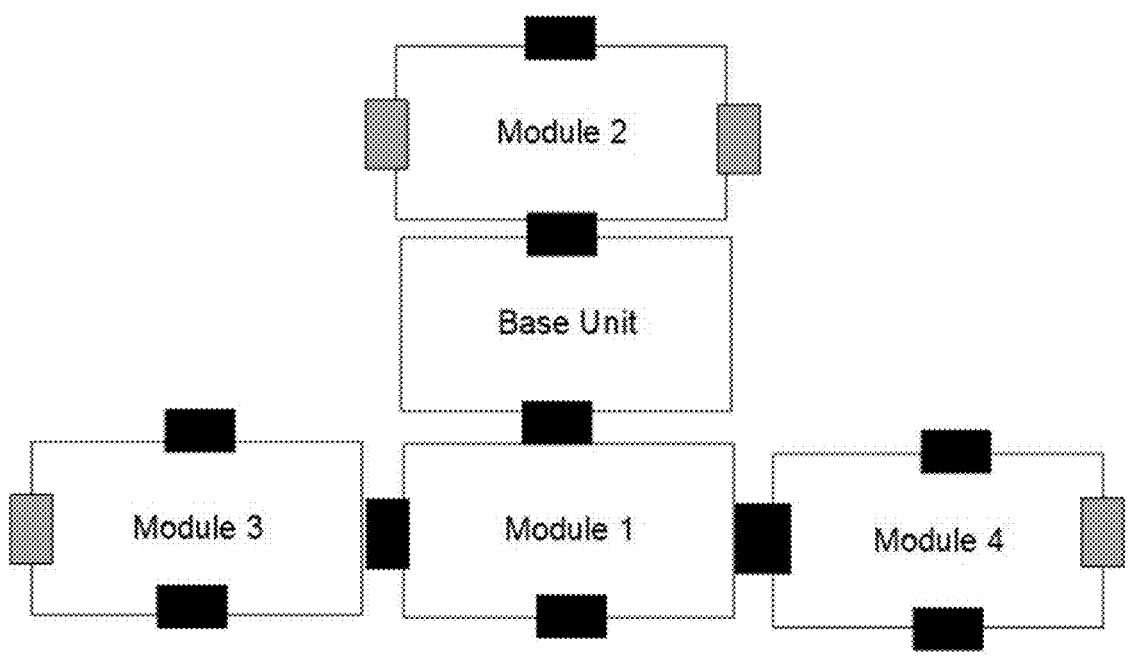

FIG. 9 illustrates that each unit may expose multiple interfaces. In particular, FIG. 9 illustrates that the unit may expose an interface on each of its sides. There may be more than one connector for each side of the unit allowing for different interfaces to take place. Different interfaces like power where additional power is drawn into the collective array from an add on unit. The add on unit can also be used as a solar array using a quantum array or implement another energy harvesting method where the unit provides an additional power source.

In some embodiments, the stack connector 734 or connector port 202 may include or may be associated with an electro-mechanical interface that allows unused system busses and resources to accessed and/or retro-fitted by the end user, after deployment, or in the field. The additional units can also have a connector used for heat transfer allowing for an integrated heat sink between units. The units can also have a heat conveyance tube or channel where the connector acts not only as an electrical and or optical interface but also as a heat sink drawing heat from one unit to another for dissipation.

The connectors (grey) shown in FIG. 9 can be covered by a shroud where the shroud needs to be removed in order to gain access to the interfaces.

Some embodiments may include a stackable computing device that includes a connector port (e.g., stack connector 734 or connector port 202) that exposes system busses and resources in a manner that allows another computing system or accessory to be stacked on top of the computing device. In some embodiments, the computing device may include an integrated heatsink and antenna structure having a cavity (e.g., cavity 212, etc.) suitable for housing the connector port.

Some embodiments may include module or component connected to a computing device that exposes a system bus, exposes and connects to other modules/components and provides power, exposes a power source for connected modules/components, exposes external interfaces with the modules/components, provides a stackable design that allows for side or horizontal stacking of components, provides heat dissipation through the stackable design, and/or provides a quantum computing interface with base unit and other modules/components.

Some embodiments may include a heatsink base that includes a frame structure, a plurality of fin components projecting outwardly from the frame structure (in which the plurality of fin components are configured to receive and hold one or more RF antenna portions), and a platform substantially surrounded by the frame structure. In some embodiments, the platform may include a connector port formed as an aperture extending through the platform. In some embodiments, the platform may be configured to have circuitry fixedly secured on a first side of the platform with a connector of the circuitry aligned with the aperture such that a connection to the circuitry can be made by circuitry of another heatsink base through the aperture from an opposed second side of the platform. In some embodiments, the platform may be a planar structure forming a partition of an inner cavity (e.g., cavity 212, etc.) within the frame structure. In some embodiments, a first portion of the inner cavity (e.g., cavity 212, etc.) on the first side of the platform may be larger than a second portion of the inner cavity (e.g., cavity 212, etc.) on the second side of the platform. In some embodiments, the frame structure may have a rectangular or square form.

Some embodiments may include an integrated heatsink and antenna housing that includes a housing casing, a housing cover and a housing base.

The housing casing may be configured to surround a first integrated heatsink and antenna structure removably secured therein. The housing casing may also form an inner cavity for holding the first integrated heatsink and antenna structure.

The housing cover may be removably secured to a top side of the housing casing such that when secured to the topside of the housing casing, the housing cover conceals the inner cavity from view from the top side of the housing casing.

The housing base may be removably secured to a bottom side of the housing casing, so that when secured to the bottom side of the housing casing, the housing base conceals the inner cavity from view from the bottom side of the housing casing. In addition, the housing base may be configured to that removal of at least one of the housing cover or the housing base allows a second integrated heatsink and antenna structure secured with another integrated heatsink and antenna housing to be stacked with and coupled to the first integrated heatsink and antenna structure secured with the housing casing.

Some embodiments may include a stackable computing device that includes a base unit configured, shaped, formed or arranged so that the customer or user can quickly physically attach additional units (e.g., an auxiliary unit, another base unit, etc.) above, below, or to the sides of the base unit to form various different configurations or computer architectures.

Some embodiments may include a stackable computing device that includes a baseline feature set, and an expandable architecture that allows end users to add specific features or functionality (e.g., digital concierge, home assistant, etc.) to the device as needed.

Some embodiments may include a stackable computing device (e.g., edge device, etc.) that includes an electro-mechanical interface that allows unused system busses and resources to be accessed and/or retro-fitted by the end user, after deployment, and/or in the field. In some embodiments, the electro-mechanical interface may be positioned on the top or bottom of the computing device to support vertical stacking. In some embodiments, the electro-mechanical interface may be positioned on the side of the stackable computing device to support horizontal stacks. In some embodiments, the stackable computing device may include an interface plug connected to the exposed electro-mechanical interface and configured to facilitate different connection and interface options. In some embodiments, the interface plug may include hardware configured to perform protocol and/or level conversion.

In some embodiments, the stackable computing device may include a LTE and or 5G module.

In some embodiments, the stackable computing device may include Power over Ethernet (POE), which may be used to obtain power from ethernet and avoid wall warts (e.g., addition of power outlet to support mounting the device on the wall, etc.).

In some embodiments, the stackable computing device may be mounted vertically and horizontally.

In some embodiments, the stackable computing device may include multiple interfaces to connect to different devices or antennas (e.g., LTE/5G antennas, GPS antenna, etc.).

In some embodiments, the stackable computing device may include augmented reality or virtual reality components. In some embodiments, the stackable computing device may include closed-circuit television (CCTV), quantum cameras, and/or micro LED cameras. In some embodiments, the stackable computing device may include multiple camera or video component that provide the device with 360 degree view of its surroundings.

In some embodiments, the stackable computing device may include a solar array for power or augmentation of power.

In some embodiments, the stackable computing device may be coupled optically or via wireless to enable expansion of capability for enhancing the computing capability and functionality.

In some embodiments, the stackable computing device may be self aware so that it may interact with other stacker units to optimize and better utilize the shared power system.

In various embodiments, the stackable computing device may be arranged horizontally, vertically, or a combination thereof. For example, the stacker units may be arranged both vertically and horizontally in a single configuration.

In various embodiments, the stackable computing device may be configured so that it may be detached from the other stacker units as a hot swap function.

In various embodiments, the stackable computing device may be include a personality profile associated with each facilitating a common stacker module with multiple functions (e.g., instead of making each stacker module for a specific purpose, etc.).

The processors may be any programmable microprocessor, microcomputer or multiple processor chip or chips that can be configured by software instructions (applications) to perform a variety of functions, including the functions of the various aspects described in this application. In some wireless devices, multiple processors may be provided, such as one processor dedicated to wireless communication functions and one processor dedicated to running other applications. Typically, software applications may be stored in the internal memory 906 before they are accessed and loaded into the processor. The processor may include internal memory sufficient to store the application software instructions.

As used in this application, the terms "component," "module," "system," and the like may refer to a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a wireless device and the wireless device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

Various aspects illustrated and described are provided merely as examples to illustrate various features of the claims. However, features shown and described with respect to any given aspect are not necessarily limited to the associated aspect and may be used or combined with other aspects that are shown and described. Further, the claims are not intended to be limited by any one example aspect. For example, one or more of the operations of the methods may be substituted for or combined with one or more operations of the methods.

The foregoing method descriptions and the process flow diagrams are provided merely as illustrative examples and are not intended to require or imply that the operations of various aspects must be performed in the order presented. As will be appreciated by one of skill in the art the order of operations in the foregoing aspects may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, components, circuits, and algorithm operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such aspect decisions should not be interpreted as causing a departure from the scope of the claims.

The hardware used to implement various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed aspects is provided to enable any person skilled in the art to make or use the claims. Various modifications to these aspects will be readily apparent to those skilled in the art, and the generic principles defined herein may be applied to other aspects without departing from the scope of the claims. Thus, the present disclosure is not intended to be limited to the aspects shown herein but is to be accorded the widest scope consistent with the following claims and the principles and novel features disclosed herein.

What is claimed is:

1. A heatsink base, comprising:
    a frame structure;
    a plurality of fin components projecting outwardly from the frame structure, wherein the plurality of fin components are configured to receive and hold one or more radio frequency (RF) antenna portions; and
    a platform substantially surrounded by the frame structure,
    wherein the platform includes an aperture extending through the platform to support a connector port,
    wherein the platform is configured to have circuitry fixedly secured on a first side of the platform with a connector of the circuitry aligned with the aperture such that a connection to the circuitry is accepted by circuitry of another heatsink base through the aperture from an opposed second side of the platform.

2. The heatsink base of claim 1, wherein the platform is a planar structure forming a partition of an inner cavity within the frame structure.

3. The heatsink base of claim 2, wherein a first portion of the inner cavity on the first side of the platform is larger than a second portion of the inner cavity on the second side of the platform.

4. The heatsink base of claim 1, wherein the frame structure has a rectangular or square form.

5. The heatsink base of claim 1, wherein the frame structure is shaped to improve the omnidirectional pattern of the one or more RF antenna portions.

6. The heatsink base of claim 1, wherein the one or more RF antenna portions include at least one or more of:
    a long term evolution (LTE) antenna portion;
    a fourth generation wireless mobile communication technology (4G) antenna portion;
    a fifth generation wireless mobile communication technology (5G) antenna portion; or
    a global positioning system antenna portion.

7. The heatsink base of claim 1, wherein the circuitry fixedly secured on the first side of the platform includes an electro-mechanical interface that provides access to unused system busses and resources after deployment in the field.

* * * * *